(12) United States Patent
Otremba et al.

(10) Patent No.: US 7,872,350 B2
(45) Date of Patent: Jan. 18, 2011

(54) MULTI-CHIP MODULE

(75) Inventors: Ralf Otremba, Kaufbeuren (DE); Josef Hoeglauer, Munich (DE); Stefan Landau, Wehrheim (DE); Erwin Huber, Munich (DE)

(73) Assignee: Qimonda AG, Munich (DE)

( * ) Notice: Subject to any disclaimer, the term of this patent is extended or adjusted under 35 U.S.C. 154(b) by 677 days.

(21) Appl. No.: 11/733,679

(22) Filed: Apr. 10, 2007

(65) Prior Publication Data

US 2008/0251912 A1      Oct. 16, 2008

(51) Int. Cl.
*H01L 23/02* (2006.01)

(52) U.S. Cl. .......... 257/723; 257/E23.18; 257/E21.505; 257/777; 257/784; 257/678; 257/666; 438/107

(58) Field of Classification Search ................. 257/777, 257/723, E23.18, E21.505, 784, 678, 666; 438/107
See application file for complete search history.

(56) References Cited

U.S. PATENT DOCUMENTS

| | | | | |
|---|---|---|---|---|
| 6,034,425 | A * | 3/2000 | Chiang et al. | 257/697 |
| 6,448,639 | B1 * | 9/2002 | Ma | 257/691 |
| 6,683,384 | B1 * | 1/2004 | Kossives et al. | 257/777 |
| 6,894,397 | B2 | 5/2005 | Pavier et al. | |
| 7,019,362 | B2 | 3/2006 | Sakamoto et al. | |
| 7,145,224 | B2 * | 12/2006 | Kawashima et al. | 257/678 |
| 2002/0167080 | A1 * | 11/2002 | Barber et al. | 257/685 |
| 2002/0167081 | A1 | 11/2002 | Kondo | |
| 2004/0063240 | A1 | 4/2004 | Madrid et al. | |
| 2004/0239439 | A1 * | 12/2004 | Aoki et al. | 333/33 |
| 2005/0109535 | A1 | 5/2005 | Audet et al. | |
| 2005/0161785 | A1 | 7/2005 | Kawashima et al. | |
| 2005/0206010 | A1 | 9/2005 | Noquil et al. | |
| 2005/0214981 | A1 * | 9/2005 | Sakano et al. | 438/127 |
| 2006/0024862 | A1 | 2/2006 | Takakusaki et al. | |
| 2006/0043545 | A1 | 3/2006 | Yea et al. | |
| 2007/0187807 | A1 * | 8/2007 | Lee et al. | 257/676 |
| 2007/0268675 | A1 * | 11/2007 | Chinda et al. | 361/748 |

FOREIGN PATENT DOCUMENTS

| | | |
|---|---|---|
| DE | 40 31 051 A1 | 5/1991 |
| DE | 102 27 106 A1 | 1/2004 |
| DE | 10334384 A1 | 4/2005 |
| DE | 10 2006 012 007 A1 | 9/2006 |
| EP | 1870929 A2 | 12/2007 |
| WO | 2005/045928 A1 | 5/2005 |
| WO | WO 2007/095468 A2 | 8/2007 |

OTHER PUBLICATIONS

Engl, M., et al., "mm-Wave Packaging: A Low-cost Solution based on a Leadless Plastic Package," 8 pages.

* cited by examiner

*Primary Examiner*—Wael M Fahmy
*Assistant Examiner*—Marc Armand
(74) *Attorney, Agent, or Firm*—John S. Economou

(57) ABSTRACT

A multi-chip module includes at least one integrated circuit chip that is electrically connected to first external terminals of the multi-chip module and at least one power semiconductor chip that is electrically connected to second external terminals of the multi-chip module. All first external terminals of the multi-chip module are arranged in a contiguous region of an terminal area of the multi-chip module.

17 Claims, 10 Drawing Sheets

MULTI-CHIP MODULE

TECHNICAL FIELD

The invention relates to multi-chip modules and more particularly to a circuit device incorporating multiple chips having different power requirements.

BACKGROUND

Multi-chip modules may contain one or more power semiconductor chips and one or more chips operating in the standard power (i.e., non-power) regime. In such multi-chip modules, the power semiconductor chip is often controlled or monitored by the standard power chip, which may be, for example, a chip containing logic circuitry.

Typically, when such chips with different power requirements are integrated in the same module, the chips are arranged such that it is easy to electrically interconnect the chips within the module in order to facilitate internal routing.

BRIEF DESCRIPTION OF THE DRAWINGS

Aspects of the invention are made more evident by way of example in the following detailed description of embodiments when read in conjunction with the attached drawing figures, wherein.

DETAILED DESCRIPTION OF ILLUSTRATIVE EMBODIMENTS

Figure 1:
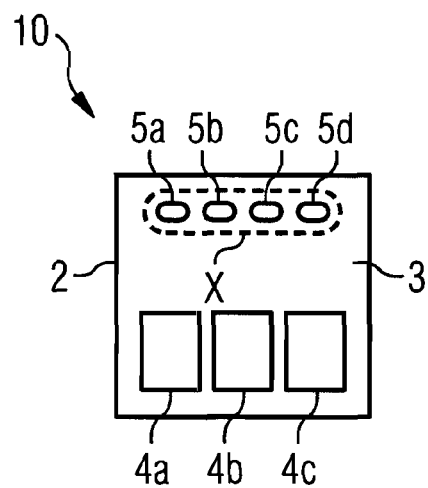
FIG. 1 illustrates a footprint of a lower power class multi-chip module having power terminals and control terminals according to a first embodiment.

Multi-chip modules described in the following comprise two or more chips, at which one of the chips is a power semiconductor chip and the other chip is a chip operated under relatively lower power conditions. For example, the power semiconductor chip may be a MOSFET (Metal Oxide Semiconductor Field Effect Transistor), JFET (Junction Field Effect Transistor), IGBT (Insulated-Gate Bipolar Transistor), BJT (Bipolar Junction Transistor), thyristor, PN diode or a Schottky diode. The chip operating at lower power conditions is typically a non-power semiconductor chip. It may be an integrated circuit designed for controlling the power semiconductor chip(s) or it may monitor electrical or ambient conditions (e.g., temperature, magnetic flux etc.) at the multi-chip module. In particular, the chip operating under lower power conditions may include logic circuitry or even software-based data processing facilities. Modules combining such different types of chips may represent "intelligent" power semiconductor devices or power semiconductor devices which integrate a part or the entire control or driver circuit of the power semiconductor chip, which otherwise were to be provided by the client on the application board on which the multi-chip module is to be mounted.

To simplify terminology, in the following the term "standard power integrated circuit" will be used for the chip operating under lower power conditions than the power semiconductor chip(s) of the multi-chip module.

A power semiconductor chip may have a power consumption which spans over a wide range, starting from about one or several amperes and about five or more volts to several hundreds of amperes or several hundreds of volts. Thus, semiconductor power chips may be attributed to different power classes. In the following, lower power class semiconductor chips, medium power class semiconductor chips and high power class semiconductor chips are mentioned. No specific limitations in terms of quantitative power consumption ranges are implied by these expressions, which are merely intended to characterize relative relationships with regard to power consumption between different power semiconductor chips.

The multi-chip module may be packaged, i.e., may comprise a mold compound. The mold compound may, for example, be made of a thermoplastic resin or a thermosetting plastic, for example, epoxy resin. It typically encapsulates all chips of the multi-chip module. A backside of one or more chip carriers on which the chips are mounted may either be over-molded by the mold compound or may remain exposed. It is also possible that the chip carrier(s) or the chips (particularly the power semiconductor chip(s)) are connected to a heat sink which remains at least partially uncovered by mold material.

The multi-chip module comprises a terminal area for electrically connecting the multi-chip module to an external assembly, for instance a circuit board or another mounting platform on which the multi-chip module is to be employed. Typically, the terminal area is located at the bottom side of the multi-chip module, i.e., at the plane of the multi-chip module which faces the circuit board.

Embodiments of the multi-chip module may implement various circuitry, among them voltage power regulators, power control circuits, DC-DC power step-up or step-down converters or AC-DC power step-up or step-down converters. Basically, virtually all power circuitry combined with standard power integrated circuits may form an embodiment in accordance with the principles outlined herein.

FIG. 1 illustrates a footprint of a multi-chip module 10. The periphery 2 of the footprint may be defined by the outline of a package of the multi-chip module 10. The package houses a power semiconductor chip (not shown) and a standard power integrated circuit (not shown) of the multi-chip module 10. As it is apparent from FIG. 1, a terminal area 3 of the package exhibits terminals 4a, 4b and 4c of the power semiconductor chip and terminals 5a, 5b, 5c, 5d of the standard power integrated circuit. These terminals 4a, 4b, 4c and 5a, 5b, 5c, 5d are intended to electrically contact the multi-chip module 10 to a mounting platform, e.g., a circuit board. This mounting platform will offer a contact area having a contact pattern which conforms to the design of the terminal area 3 of the multi-chip module 10 illustrated in FIG. 1. The multi-chip module 10 may be surface mounted on the mounting platform using any appropriate planar mounting technique.

The standard power integrated circuit terminals 5a, 5b, 5c, 5d are designed as small area metal contacts, whereas the area of the terminals 4a, 4b, 4c of the power semiconductor chip are larger in size. In the following, the terminals of the standard power integrated circuit are termed first external terminals 5a, 5b, 5c, 5d and the terminals of the power semiconductor chip are termed second external terminals 4a, 4b, 4c.

As it is apparent from FIG. 1, the first external terminals 5a, 5b, 5c, 5d define a contiguous region X. "Contiguous region" herein means that the region X is defined by first external terminals only. In this case, like in FIG. 1, no second external terminals 4a, 4b, 4c are arranged in-between any of two first external terminals 5a, 5b, 5c, 5d and split the contiguous region of first external terminals into two or more parts. More specifically, in FIG. 1, the first external terminals 5a, 5b, 5c, 5d are linearly arranged at one side of the multi-chip module 10, and the second external terminals 4a, 4b, 4c are linearly arranged along the opposite side of the multi-chip module 10. A contiguous region in which first external terminals 5a, 5b, 5c, 5d are located is separated from a contiguous region in which second external terminals 4a, 4b, 4c are located by an imaginary straight line.

Figure 2:
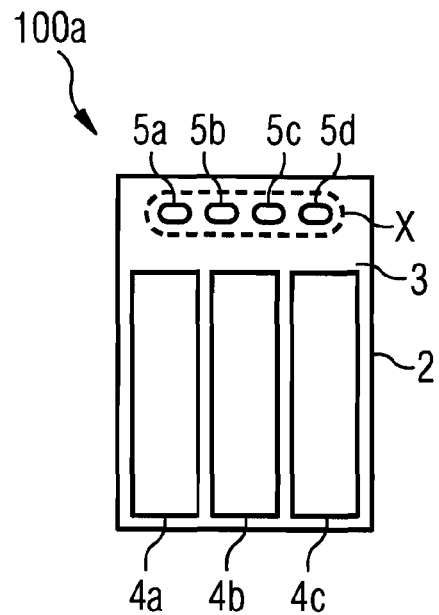
FIG. 2 illustrates a footprint of a medium power class multi-chip module having power terminals and control terminals according to the first embodiment.

Same reference signs designate like parts in the following drawings. FIG. 2 illustrates the layout of a terminal area 3 of a multi-chip module 100a which is designed for medium power class operation. The module 100a may comprise virtually the same circuitry as the multi-chip module 10, with the exception that a power semiconductor chip configured to operate in a higher power regime is used. As a result, the area of the second external terminals 4a, 4b, 4c are larger in size than in FIG. 1. This is achieved by increasing the dimension of the second external terminals 4a, 4b, 4c in a direction perpendicular to the linear orientation of the first external terminals 5a, 5b, 5c, 5d. As the first external terminals 5a, 5b, 5c, 5d are arranged to define a contiguous region X separated from the area in which the second external terminals 4a, 4b, 4c are disposed, the "growth" of the second external terminals 4a, 4b, 4c does not come into conflict with the layout of the first external terminals 5a, 5b, 5c, 5d. In other words, the layout of the first external terminals 5a, 5b, 5c, 5d may remain unchanged.

Figure 3:
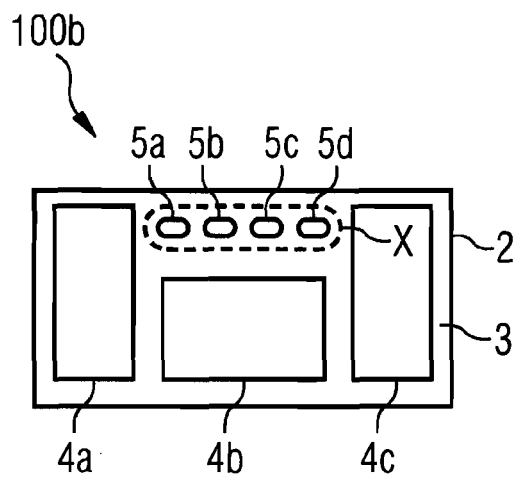
FIG. 3 illustrates a footprint of another medium power class multi-chip module having power terminals and control terminals according to the first embodiment.

FIG. 3 illustrates another design of a terminal area of a multi-chip module 100b. The multi-chip module 100b belongs to the same medium power class as the multi-chip module 100a depicted in FIG. 2, i.e., may be implemented with exactly the same circuitry and components as multi-chip module 100a. In FIG. 3, the required enlargement of the contact areas of the second external terminals 4a, 4b, 4c is accomplished by increasing the dimension of the periphery 2 of the multi-chip module 100b in a dimension parallel to the linear orientation of the first external terminals 5a, 5b, 5c, 5d. A contiguous region X which is defined by the locations of first external terminals 5a, 5b, 5c, 5d is separated from a contiguous region in which second external terminals 4a, 4b, 4c are located by an imaginary U-shaped line. Again, the layout of the first external terminals 5a, 5b, 5c, 5d may remain unchanged.

Figure 4:
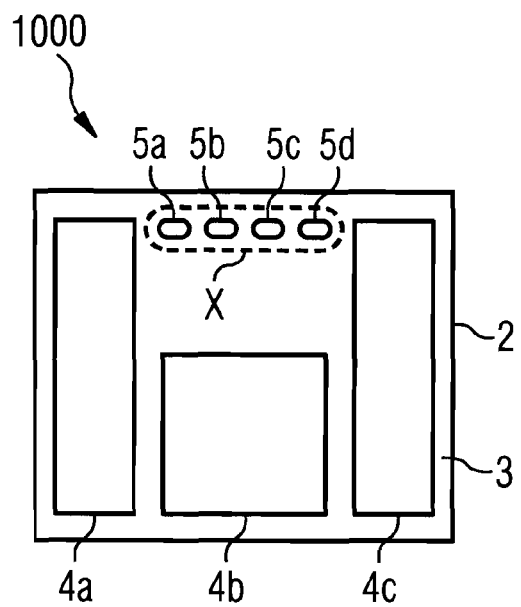
FIG. 4 illustrates a footprint of a high power class multi-chip module having power terminals and control terminals according to the first embodiment.

FIG. 4 exemplifies a possible layout of the first external terminals 5a, 5b, 5c, 5d and second external terminals 4a, 4b, 4c in the case of a corresponding multi-chip module 1000 belonging to a high power class. As mentioned before with regard to medium power class multi-chip modules 100a, 100b, high power class multi-chip module 1000 may have the same functionality as multi-chip modules 10, 100a, 100b, however is scaled-up to higher operating powers. As a result, multi-chip module 1000 has still a larger size than multi-chip modules 100a, 100b, because the size of the second external terminals 4a, 4b, 4c scales with the power requirement. Here, the periphery 2 of the multi-chip module 1000 is increased in a direction parallel to the row of first external terminals 5a, 5b, 5c, 5d and in a direction perpendicular to the row of first external terminals 5a, 5b, 5c, 5d. An imaginary U-shaped line separates first and second external terminals over the terminal area 3. As for medium power class multi-chip modules 100a, 100b, the layout of the first external terminals 5a, 5b, 5c, 5d remains the same.

As a result of this layout concept, there is no need for a user (e.g., a client of the module manufacturer) to redesign the layout of the contact means associated with the first external terminals 5a, 5b, 5c, 5d on a mounting platform, e.g., an application circuit board, when advancing from a low power class application to a medium power class application or a high power class application. Only the layout of the contact means associated with the second external terminals 4a, 4b, 4c has to be adapted to the layout of the second external terminals 4a, 4b, 4c. This facilitates the circuitry layout on the mounting platform and enables the user to design circuit boards having a higher practicability for applications involving various power demands.

It is to be noted that the high power class multi-chip module 1000 may also be designed in line with the design rules exemplified by multi-chip module 100*a*, which only exhibits a "growth" in one dimension. In this case, the side of the multi-chip module 1000 adjacent to the row of first external terminals 5*a*, 5*b*, 5*c*, 5*d* remains free of second external terminals 4*a*, 4*b*, 4*c*.

Figure 5:
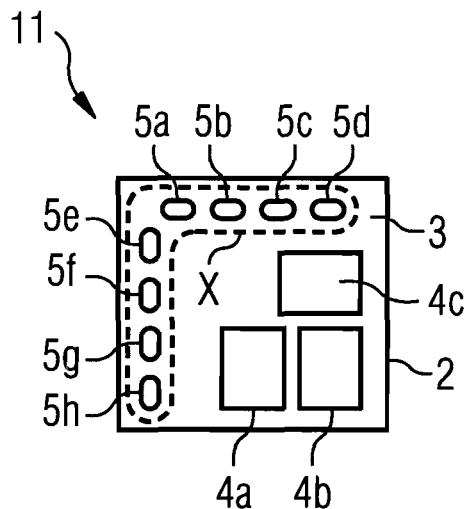
FIG. 5 illustrates a footprint of a lower power class multi-chip module having power terminals and control terminals according to a second embodiment.
Figure 6:
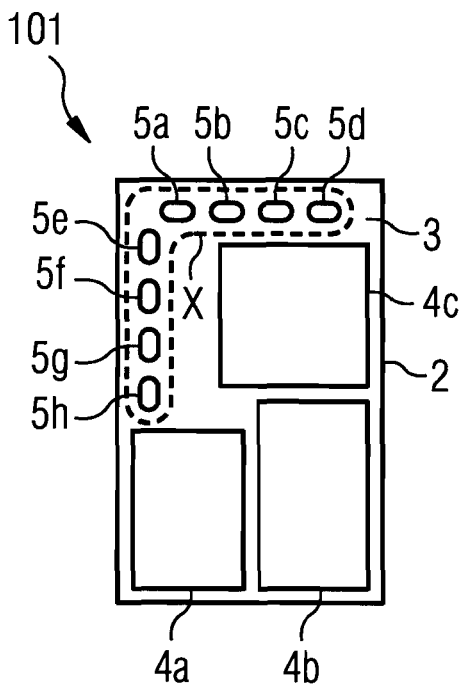
FIG. 6 illustrates a footprint of a medium power class multi-chip module having power terminals and control terminals according to the second embodiment.
Figure 7:
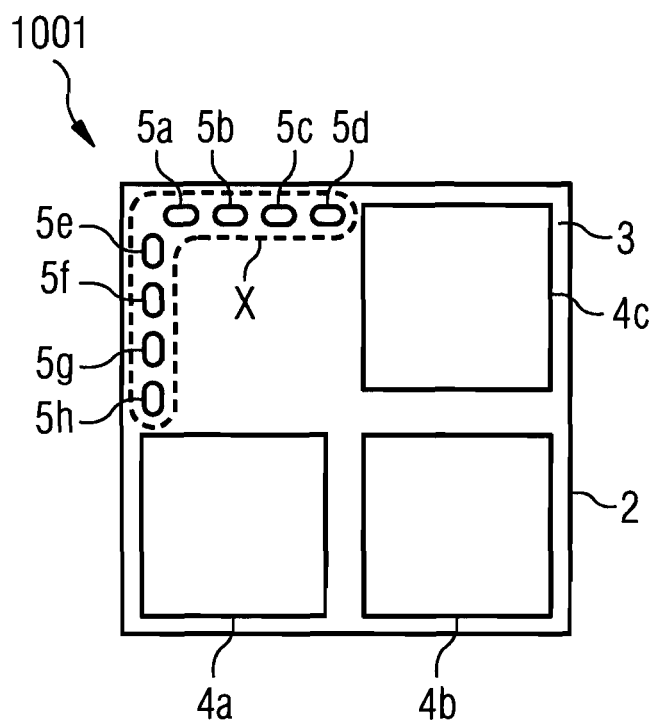
FIG. 7 illustrates a footprint of a high power class multi-chip module having power terminals and control terminals according to the second embodiment.

FIGS. 5, 6 and 7 illustrate a second embodiment, in which the contiguous region X defined by first external terminals 5*a*, 5*b*, 5*c*, 5*d*, 5*e*, 5*f*, 5*g*, 5*h* extends at least partially along two sides of the terminal area 3 of the multi-chip module. In multi-chip module 11 depicted in FIG. 5, both sides of the multi-chip module 11 at which first external terminals 5*a*, 5*b*, 5*c*, 5*d*, 5*e*, 5*f*, 5*g*, 5*h* are located, are free of second external terminals 4*a*, 4*b*, 4*c*. On advancing to higher power classes, the layout of the first external terminals 5*a*, 5*b*, 5*c*, 5*d*, 5*e*, 5*f*, 5*g*, 5*h* remains unchanged in medium power class multi-chip module 101 (FIG. 6) and high power class multi-chip module 1001 (FIG. 7). Concerning medium power class multi-chip module 101, the size of the module is increased only in one dimension, namely the dimension parallel to the column of first external terminals 5*e*, 5*f*, 5*g*, 5*h*. For high power class multi-chip module 1001, the increase in size involves two dimensions, namely the dimension parallel to first external terminal column 5*e*, 5*f*, 5*g*, 5*h* and the dimension parallel to first external terminal row 5*a*, 5*b*, 5*c*, 5*d*. It is to be noted that the sides opposite to the sides at which the first external terminals 5*a*, 5*b*, 5*c*, 5*d*, 5*e*, 5*f*, 5*g*, 5*h* are located are free of first external terminals. Further, the first external terminals 5*a*, 5*b*, 5*c*, 5*d*, 5*e*, 5*f*, 5*g*, 5*h* are again arranged to define a contiguous region X which is not broken or intersected by second external terminals 4*a*, 4*b*, 4*c*. An imaginary L-shaped line separates the contiguous region where the first external terminals 5*a*, 5*b*, 5*c*, 5*d*, 5*e*, 5*f*, 5*g*, 5*h* are located from the region where the second external terminals 4*a*, 4*b*, 4*c* are located.

Figure 8:
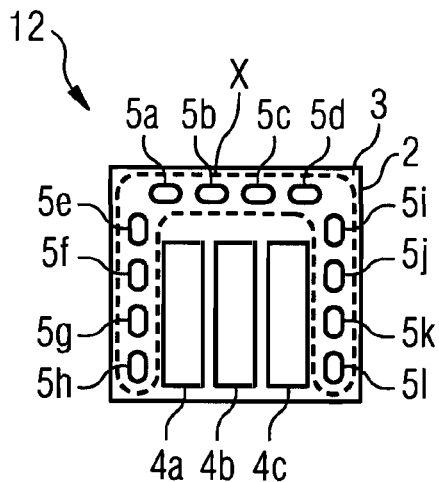
FIG. 8 illustrates a footprint of a lower power class multi-chip module having power terminals and control terminals according to a third embodiment.
Figure 9:
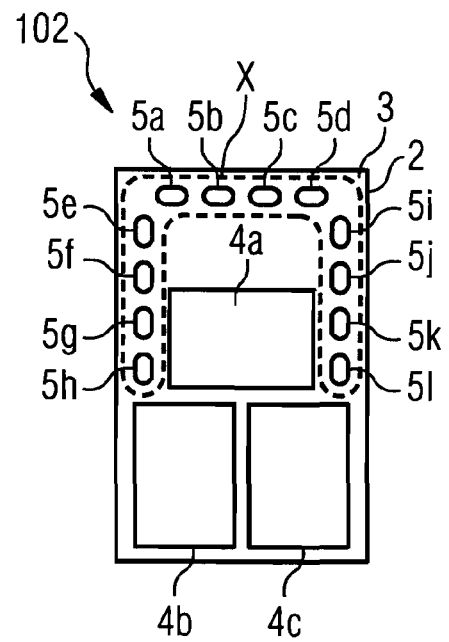
FIG. 9 illustrates a footprint of a medium power class multi-chip module having power terminals and control terminals according to the third embodiment.
Figure 10:
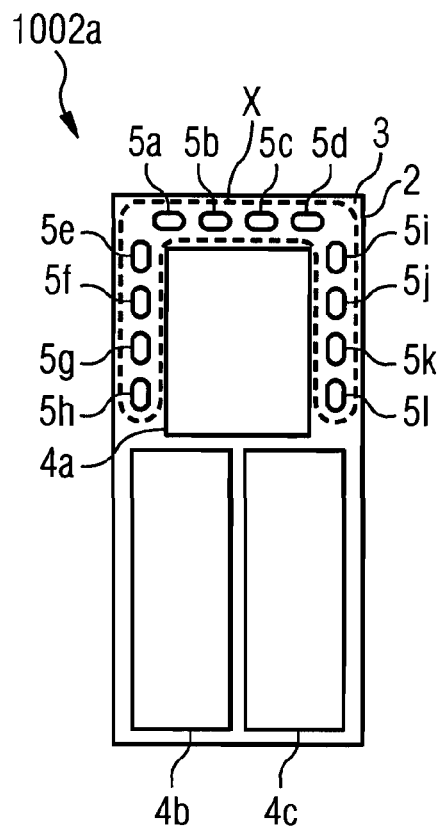
FIG. 10 illustrates a footprint of a high power class multi-chip module having power terminals and control terminals according to the third embodiment.
Figure 11:
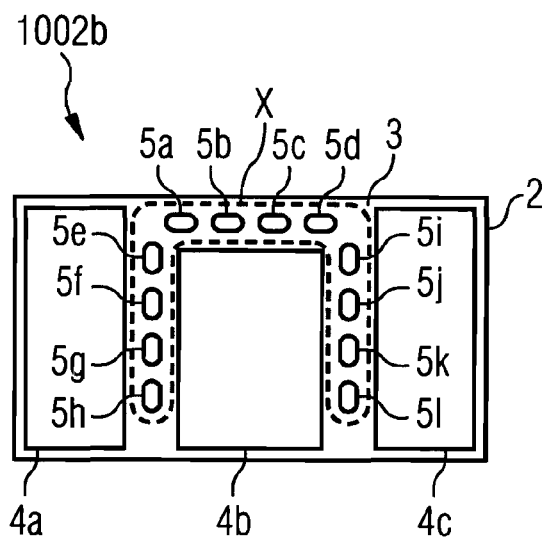
FIG. 11 illustrates a footprint of another high power class multi-chip module having power terminals and control terminals according to the third embodiment.

FIGS. 8, 9, 10 and 11 illustrate a possible layout of the first and second external terminals of multi-chip modules 12, 102, 1002*a*, 1002*b* of different power classes according to a third embodiment. In the third embodiment, first external terminals 5*a*, 5*b*, 5*c*, 5*d*, 5*e*, 5*f*, 5*g*, 5*h*, 5*i*, 5*j*, 5*k*, 5*l* are arranged to define a contiguous region X of U-shape design. In FIGS. 8, 9 and 10, the first external terminals 5*a*, 5*b*, 5*c*, 5*d*, 5*e*, 5*f*, 5*g*, 5*h*, 5*i*, 5*j*, 5*k*, 5*l* are arranged in a row and two adjoining columns at three sides of the rectangular periphery 2 of the multi-chip module 12, 102, 1002*a*. As it is apparent in FIGS. 9 and 10, the medium power class multi-chip module 102 and the high power class multi-chip module 1002*a* may be expanded in one dimension parallel to the columns of first external terminals 5*e*, 5*f*, 5*g*, 5*h* and 5*i*, 5*j*, 5*k*, 5*l* arranged at opposite sides of the multi-chip modules 102, 1002*a*. Another possibility is depicted in FIG. 11. Here, the high power class multi-chip module 1002*b* is expanded in the direction parallel to the row of first external terminals 5*a*, 5*b*, 5*c*, 5*d*. This is achieved by replacing the second external terminals 4*a* and 4*c* to the lateral outer sides of the columns of the first external terminals 5*e*, 5*f*, 5*g*, 5*h* and 5*i*, 5*j*, 5*k*, 5*l*. It is to be noted that the side opposite to the row of first external terminals 5*a*, 5*b*, 5*c*, 5*d* is free of first external terminals in all embodiments described so far.

Figure 12:
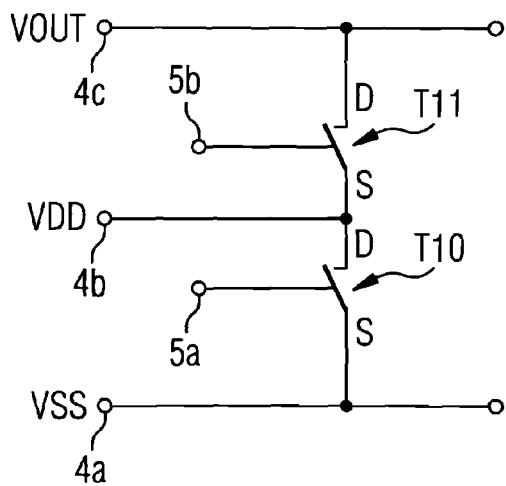
FIG. 12 illustrates a circuit diagram of a circuitry which may be implemented in multi-chip modules with footprints as shown in FIGS. 1-11.

FIG. 12 exemplifies a possible circuitry which may be implemented in each of the multi-chip modules shown in FIGS. 1-11. The circuitry is a half-bridge of a DC-DC voltage step-up converter converting an input voltage VDD-VSS to an output voltage VOUT-VSS. The circuitry comprises two power MOSFETs T10 and T11 which are interconnected in series. The first MOSFET T10 is mounted on the second external terminal 4*a* (VSS), which contacts the source S of MOSFET T10. The drain D of MOSFET T10 is interconnected (e.g., by wirebonding) to the second terminal 4*b* (VDD), which simultaneously serves as a chip pad for second MOSFET T11 and contacts to its source S. The second external terminal 4*c* is used for VOUT and interconnected to the drain D of second MOSFET T11.

The first external terminals 5*a*, 5*b*, . . . may be used for various purposes depending on the design of the circuitry. By way of example, first external terminal 5*a* may be connected to the gate G of first MOSFET T10 and first external terminal 5*b* may be connected to the gate G of second MOSFET T11. Other choices are possible. For instance, the multi-chip module (FIG. 1-11) may comprise logic circuitry (i.e., one or more integrated circuits) which is used to control the gates G of MOSFETs T10, T11. In this case, the first external terminals 5*a*, 5*b*, . . . may be connected to VSS, VDD, Enable, Read/Write, . . . and other input signals used to operate the integrated circuits.

Figure 13:
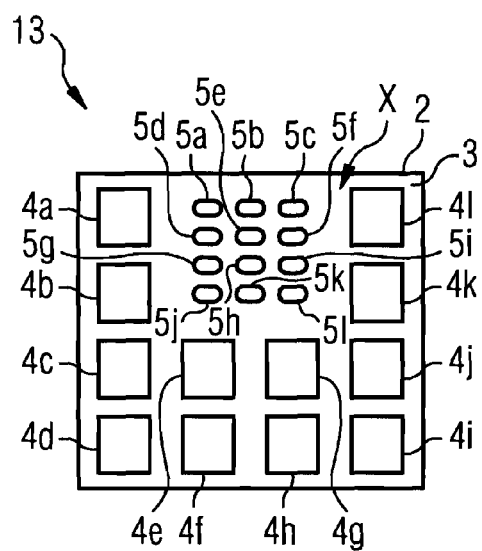
FIG. 13 illustrates a footprint of a lower power class multi-chip module having power terminals and control terminals according to a fourth embodiment.
Figure 14:
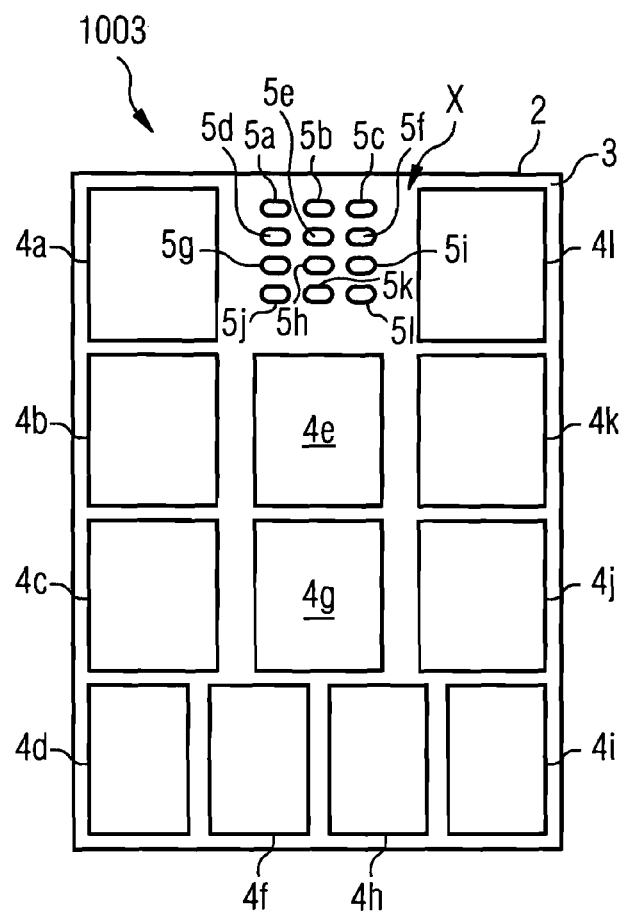
FIG. 14 illustrates a footprint of a high power class multi-chip module having power terminals and control terminals according to the fourth embodiment.

FIGS. 13 and 14 illustrate a fourth embodiment in which first external terminals 5*a*, 5*b*, 5*c*, 5*d*, 5*e*, 5*f*, 5*g*, 5*h*, 5*i*, 5*j*, 5*k*, 5*l* are arranged in a two-dimensional array defining the contiguous region X. Thus, a part of the first external terminals, namely terminals 5*d*, 5*e*, 5*f*, 5*g*, 5*h*, 5*i*, 5*j*, 5*k*, 5*l*, are not arranged directly along a side or periphery 2 of the multi-chip modules 13, 1003. Multi-chip module 13 may be a low power class multi-chip module and multi-chip module 1003 may be a high power class multi-chip module. Further, in the fourth embodiment, by way of example, twelve second external terminals 4*a*, 4*b*, 4*c*, 4*d*, 4*e*, 4*f*, 4*g*, 4*h*, 4*i*, 4*j*, 4*k*, 4*l* are provided. Thus, typically a plurality of power semiconductor chips are contained in multi-chip modules 13, 1003. As a note, the first, second and third embodiments are also not limited to three second external terminals 4*a*, 4*b*, 4*c* but may likewise contain a larger number of second external terminals and power semiconductor chips.

In the fourth embodiment (FIGS. 13 and 14) the first external terminals 5*a*, 5*b*, 5*c*, 5*d*, 5*e*, 5*f*, 5*g*, 5*h*, 5*i*, 5*j*, 5*k*, 5*l* are arranged to define a confined, contiguous region X separated from the second external terminals 4*a*, 4*b*, 4*c*, 4*d*, 4*e*, 4*f*, 4*g*, 4*h*, 4*i*, 4*j*, 4*k*, 4*l* by an imaginary U-shaped line. Thus, the size expansion of the second external terminals 4*a*, 4*b*, 4*c*, 4*d*, 4*e*, 4*f*, 4*g*, 4*h*, 4*i*, 4*j*, 4*k*, 4*l* as shown in FIG. 14 does not interfere with the layout of the first external terminals 5*a*, 5*b*, 5*c*, 5*d*, 5*e*, 5*f*, 5*g*, 5*h*, 5*i*, 5*j*, 5*k*, 5*l*, which may remain unchanged through all power classes.

Figure 15:
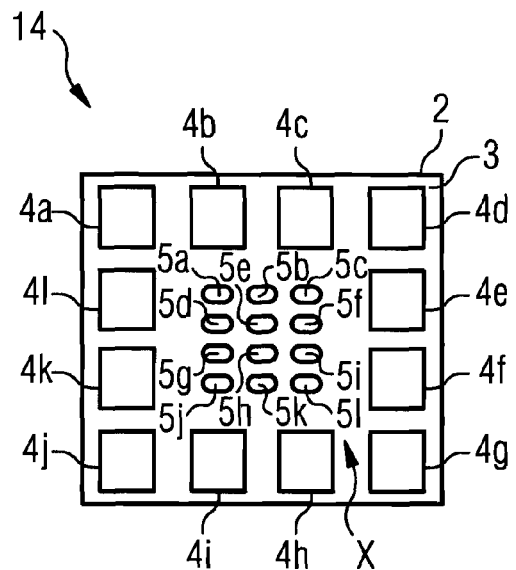
FIG. 15 illustrates a footprint of a lower power class multi-chip module having power terminals and control terminals according to a fifth embodiment.
Figure 16:
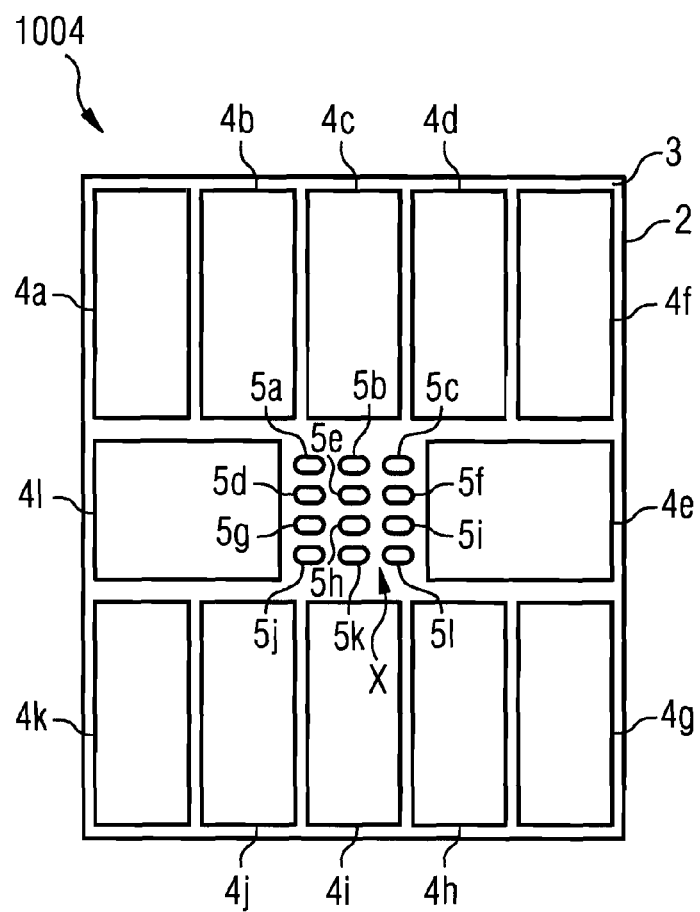
FIG. 16 illustrates a footprint of a high power class multi-chip module having power terminals and control terminals according to the fifth embodiment.

FIGS. 15 and 16 illustrate a low power class multi-chip module 14 and a high power class multi-chip module 1004 according to a fifth embodiment. Here, the first external terminals 5*a*, 5*b*, 5*c*, 5*d*, 5*e*, 5*f*, 5*g*, 5*h*, 5*i*, 5*j*, 5*k*, 5*l* are again arranged in a two-dimensional array, e.g., a 4×3 matrix. All sides of the array are distant to the peripheries 2 of the multi-chip modules 14, 1004. In particular, as exemplified in FIGS. 15, 16, the array of first external terminals 5*a*, 5*b*, 5*c*, 5*d*, 5*e*, 5*f*, 5*g*, 5*h*, 5*i*, 5*j*, 5*k*, 5*l* may be situated at the center of the terminal area 3 of the multi-chip modules 14, 1004. The second external terminals 4*a*, 4*b*, 4*c*, 4*d*, 4*e*, 4*f*, 4*g*, 4*h*, 4*i*, 4*j*, 4*k*, 4*l* may be arranged circumferential to the central array of first external terminals 5*a*, 5*b*, 5*c*, 5*d*, 5*e*, 5*f*, 5*g*, 5*h*, 5*i*, 5*j*, 5*k*, 5*l* constituting the contiguous region X.

The high power class chip-module 1004 is expanded in both dimensions relative to the low power class multi-chip module 14, whereby the pattern of the second external terminals 4*a*, 4*b*, 4*c*, 4*d*, 4*e*, 4*f*, 4*g*, 4*h*, 4*i*, 4*j*, 4*k*, 4*l* is rearranged. It is to be noted that there is neither a need for rearrangement of the pattern of second external terminals 4*a*, 4*b*, 4*c*, 4*d*, 4*e*, 4*f*, 4*g*, 4*h*, 4*i*, 4*j*, 4*k*, 4*l* nor a need for expanding the multi-chip module 1004 in both dimensions when advancing to higher power class modules. Again, the first external terminals 5*a*, 5*b*, 5*c*, 5*d*, 5*e*, 5*f*, 5*g*, 5*h*, 5*i*, 5*j*, 5*k*, 5*l* are not spread between the second external terminals 4*a*, 4*b*, 4*c*, 4*d*, 4*e*, 4*f*, 4*g*, 4*h*, 4*i*, 4*j*, 4*k*, 4*l* but define a confined and contiguous region X which allows to retain the layout of the first external terminals 5*a*, 5*b*, 5*c*, 5*d*, 5*e*, 5*f*, 5*g*, 5*h*, 5*i*, 5*j*, 5*k*, 5*l* through power scaling. The contiguous region X of first external terminals 5*a*, 5*b*, 5*c*, 5*d*, 5*e*, 5*f*, 5*g*, 5*h*, 5*i*, 5*j*, 5*k*, 5*l* is separated from the surrounding second external terminals 4*a*, 4*b*, 4*c*, 4*d*, 4*e*, 4*f*, 4*g*, 4*h*, 4*i*, 4*j*, 4*k*, 4*l* by an imaginary, rectangular (more general, polygonal) closed line.

In all embodiments, second terminals for power semiconductor chips may serve as a chip carrier or die pad on which a power semiconductor chip is mounted. As the size of the power semiconductor chip likewise scales with the power class of the chip, the same considerations as explained for second external terminals apply to die pads or chip carriers for power semiconductor chips.

In most cases, as many semiconductor power chips are vertical devices (i.e., the load current flows from one face of the chip to the other face), the die pad on which the power semiconductor chip is mounted also serves as a external electric contact, i.e., shows up as a second external terminal on the footprint of the module. However, this must not necessarily be the case. It is also possible that a die pad of a power semiconductor chip is not used as a second external terminal for providing an electric connection to the application circuit board.

Figure 17:
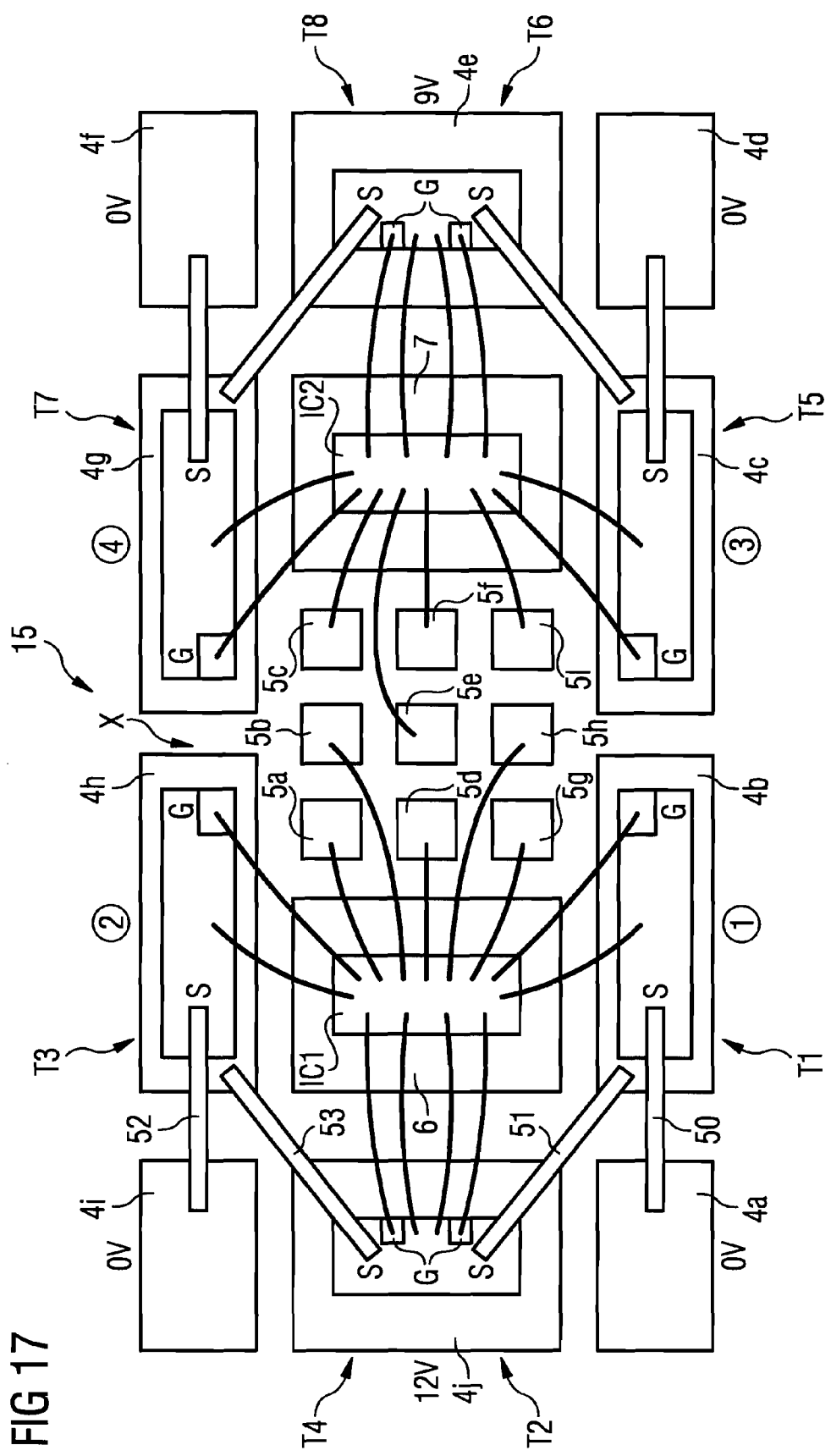
FIG. 17 illustrates a plan view of a multi-chip module implementing circuitry of a DC-DC voltage converter having four half bridges and two integrated circuits for controlling the power semiconductor chips.
Figure 18A:
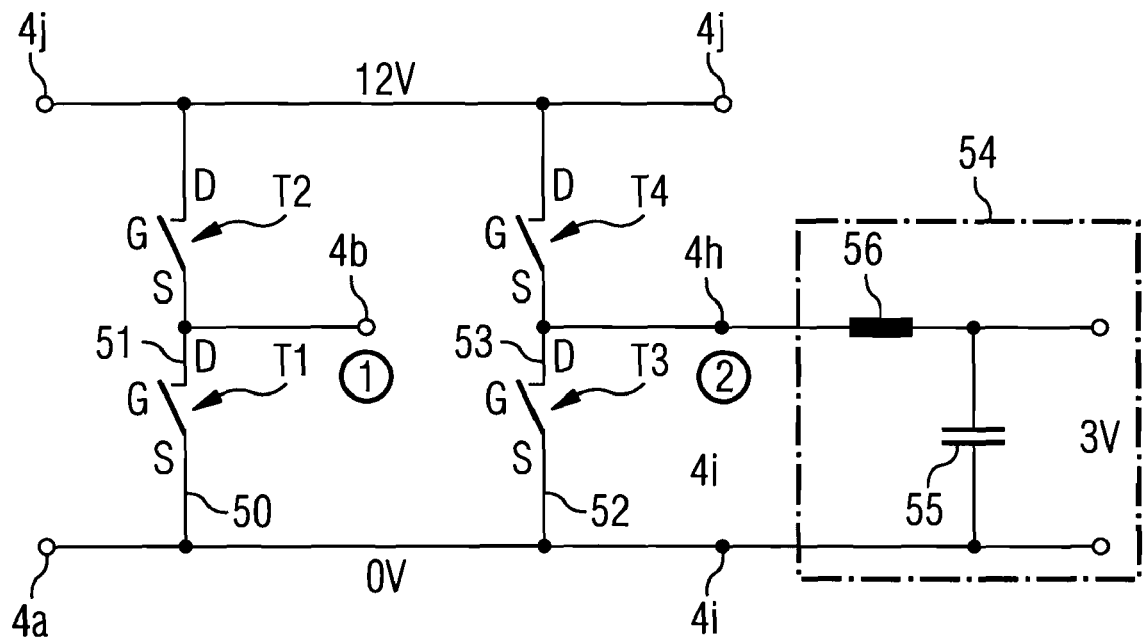
FIG. 18a illustrates a partial circuit diagram of the circuitry shown in FIG. 17.
Figure 18B:
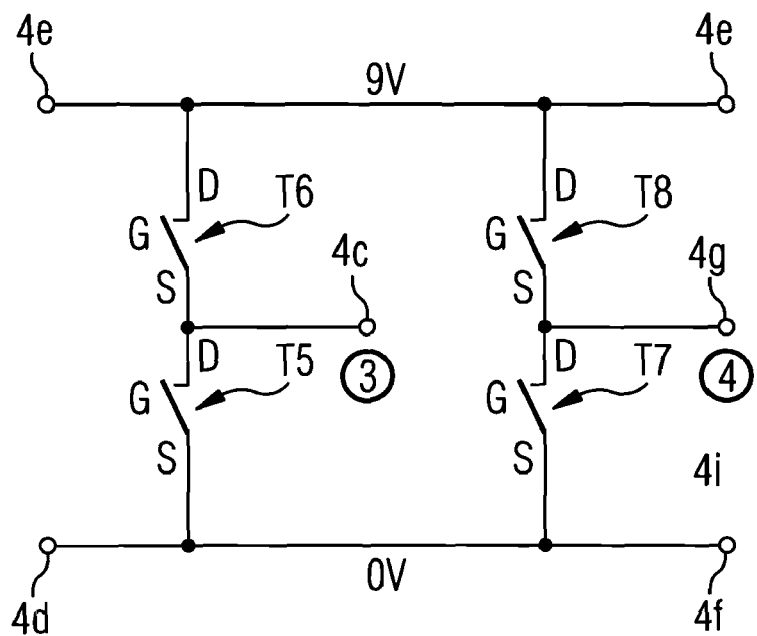
FIG. 18b illustrates another partial circuit diagram of the circuitry shown in FIG. 17.

FIG. 17 is a top view of an embodiment of a multi-chip module 15 with optimized footprint before packaging. First external terminals 5*a*, 5*b*, 5*c*, 5*d*, 5*e*, 5*f*, 5*g*, 5*h*, 5*i* are arranged in a two dimensional 3×3 array in the central part of the module 15. Second external terminals are denoted by reference signs 4*a*, 4*b*, 4*c*, 4*d*, 4*e*, 4*f*, 4*g*, 4*h*, 4*i*, 4*j*. The multi-chip module 15 implements two half-bridges of a DC-DC voltage step-down converter having an input voltage of 12 V and two half-bridges of a DC-DC voltage converter having an input voltage of 9 V. FIG. 18*a* illustrates a schematic of the two half-bridges of the 12 V DC-DC voltage converter and FIG. 18*b* illustrates a schematic of the 9 V DC-DC voltage converter.

First, with reference to FIG. 18*a*, the 12 V DC-DC voltage converter is described. It comprises a first half-bridge having a first power switch T1 and a second power switch T2 as well as a second half-bridge having a third power switch T3 and a fourth power switch T4. All power switches T1, T2, T3, T4 are typically implemented as n-channel MOSFETs. The power switches T1, T3 are termed "low-sider" and the power switches T2, T4 are termed "high-sider" in the art. In the multi-chip module 15, the low-siders T1, T3 are mounted on second external terminals 4*b*, 4*h*, respectively, and the high-siders T2, T4 are commonly mounted on the second external terminal 4*j*.

More specifically, ground (e.g., 0 V) is applied to second external terminals 4*a*, 4*i*. Bondwire 50 interconnects second external terminal 4*a* to the source S of power switch T1. The drain D of power switch T1 is in electrical contact to second external terminal 4*b*. Bondwire 51 interconnects the drain D of power switch T1 to the source S of power switch T2. The drain D of power switch T2 is electrically connected to second external terminal 4*j* representing the 12 V input of the DC-DC voltage converter.

The second half-bridge is designed analogously. Bondwire 52 interconnects the second external terminal 4*i* at ground potential 0 V with the source S of power switch T3. The drain D of power switch T3 is electrically connected to second external terminal 4*h*. The second external terminal 4*h* is interconnected to the source S of power switch T4 via bondwire 53. The drain D of power switch 4 is interconnected to the second external terminal 4*j*.

A dashed line encloses a circuitry part 54 of the DC-DC voltage converter which is implemented outside the multi-chip module 15 on the application circuit board (not shown). The circuitry may comprise a capacitor 55 connected in parallel to an output DC voltage of, e.g., 3 V and an inductor 56 connected in-between the output terminal at 3 V and the second external terminal 4*h*. A circuitry similar to external circuitry 54 is coupled to second external terminals 4*a*, 4*b* to power the first half-bridge comprising power switches T1, T2. This external circuitry is not depicted in FIG. 18*a* for the sake of simplicity.

The 9 V DC-DC voltage converter, as shown in FIG. 18*b*, established in the right half of the multi-chip module 15 is designed analogously to the 12 V DC-DC voltage converter explained above. Briefly, low-sider power switch T5 is mounted on second external terminal 4*c* and low-sider power switch T7 is mounted on second external terminal 4*g*. High-sider power switches T6 and T7 are commonly mounted on second external terminal 4*e*. As the circuit design of the 9 V DC-DC voltage converter is analogous to the circuit design of the 12 V DC-DC voltage converter, a detailed description is omitted to avoid reiteration. It is to be noted that second external terminals 4*d*, 4*c* of the first half-bridge and second external terminals 4*f*, 4*g* of the second half-bridge are coupled to an external circuitry similar to circuitry 54, which is established externally on the application circuit board (not shown).

The half-bridges T1, T2 and T3, T4 of the 12 V DC-DC voltage converter are controlled by standard power integrated circuit IC1. The half-bridges T5, T6 and T7, T8 of the 9 V DC-DC voltage converter are controlled by standard power integrated circuit IC2. Standard power integrated circuit IC1 is mounted on a chip pad 6 and standard power integrated circuit IC2 is mounted on a chip pad 7. It is to be noted that chip pads 6 and 7 may or may not represent first external terminals for electric interconnection to the application circuit board. In either case, as the standard power integrated circuits IC1 and IC2 do not scale with the power requirements (i.e., power classes) of the multi-chip module 15, they may have a fixed size. Integrated circuits IC1 and IC2 are configured to control the gates G of the power switches T1 to T8 and may optionally include PWM (pulse width modulation) functionality.

As is apparent from the above, the footprint of the multi-chip module 15 shown in FIG. 17 basically corresponds to the footprint of the multi-chip modules 14, 1004 of the fifth embodiment illustrated in FIGS. 15 and 16. Thus, a central region of the footprint defined by the 3×3 array of the first external terminals 5*a*, 5*b*, 5*c*, 5*d*, 5*e*, 5*f*, 5*g*, 5*h*, 5*i*, and, where applicable, of IC die pads 6, 7 is invariant to power scaling. As mentioned before, this is beneficial to the user being concerned with application board design.

It is to be noted that the electrical interconnections 50, 51, 52, 53 of the 12 V DC-DC voltage converter and the corresponding interconnections of the 9 V DC-DC voltage converter in the right part of FIG. 17 must not be accomplished by wire-bonding but may use any other suitable interconnection technique, such as, e.g., clip-bonding or ribbon-bonding.

In the embodiments shown in FIGS. 1 to 16, die pads for mounting the (standard power) integrated circuits are omitted. Such die pads must not be visible at the bottom side (footprint) of the multi-chip module and may generally be located at arbitrary positions within the multi-chip module. In many cases, they will be arranged within the confined region where the first external terminals are located.

Figure 19:
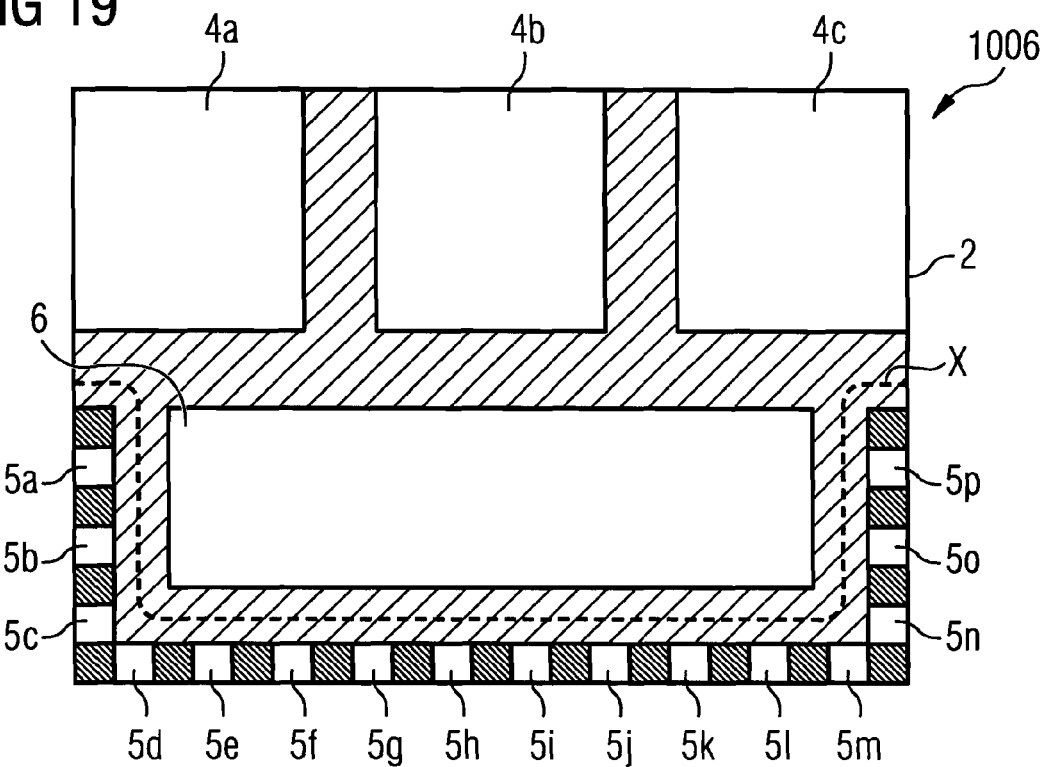
FIG. 19 illustrates a footprint of a power multi-chip module having power terminals and control terminals according to a sixth embodiment.

FIG. 19 illustrates a footprint of a further embodiment of a multi-chip module 1006. Second external terminals 4a, 4b, 4c are located along one side of the multi-chip module 1006. Again, the second terminals 4a, 4b, 4c may be semiconductor power chip pads or bond pads used for bonding interconnecting elements (e.g., wirebond pads).

Pad 6 is a die pad for one or more (standard power) integrated chips. Pad 6 is located in the vicinity and along the opposite side of the periphery 2 of the multi-chip module 1006. Pad 6 may or may not constitute a first external terminal for coupling the standard power integrated circuits disposed thereon to an application board. Further, first external terminals 5a, 5b, 5c, 5d, 5e, 5f, 5g, 5h, 5i, 5j, 5k, 5l, 5m, 5n, 5o, 5p are arranged in a spacing between the periphery 2 of the multi-chip module 1006 and the standard power integrated circuit pad 6. As both the standard power integrated circuit pads 6 and the first external terminals 5a, 5b, 5c, 5d, 5e, 5f, 5g, 5h, 5i, 5j, 5k, 5l, 5m, 5n, 5o, 5p are located in a region which is separated from a region in which the second external terminals 4a, 4b, 4c are situated, the multi-chip module 1006 allows to be power-scaled without the need to rearrange the first external terminals 5a, 5b, 5c, 5d, 5e, 5f, 5g, 5h, 5i, 5j, 5k, 5l, 5m, 5n, 5o, 5p. The location of these terminals define a contiguous region X in which no second terminal 4a, 4b, 4c is situated.

Figure 20:
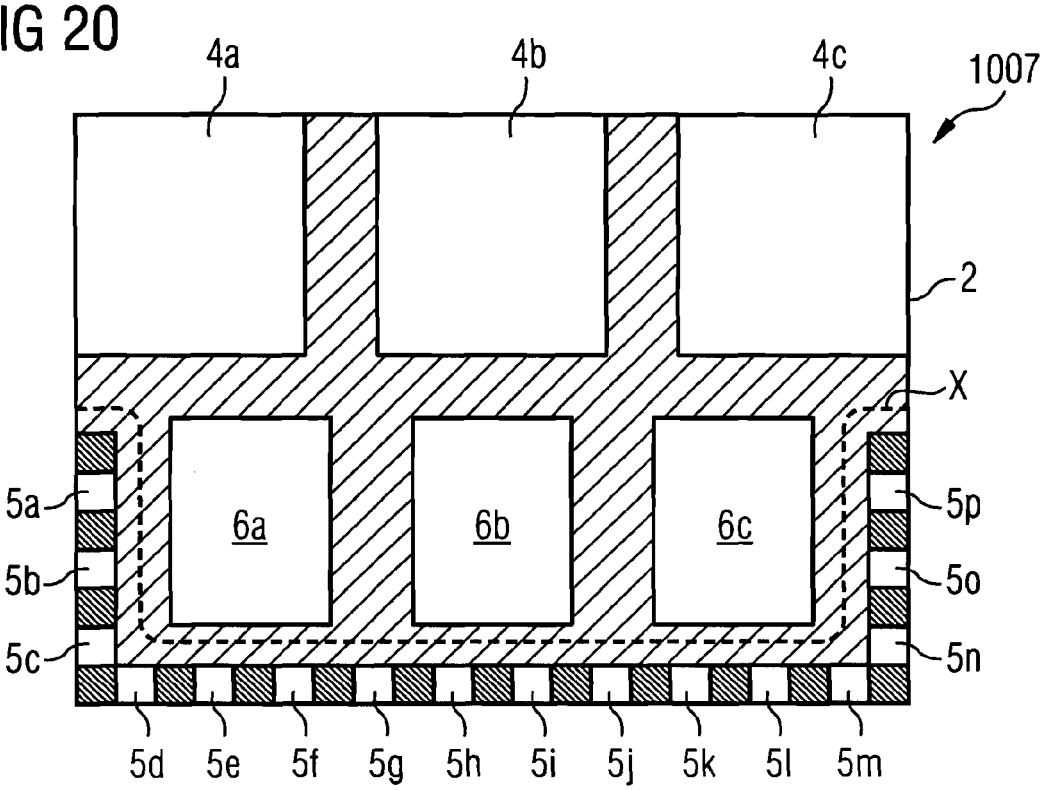
FIG. 20 illustrates a footprint of a power multi-chip module having power terminals and control terminals according to a variant of the embodiment shown in FIG. 19.

FIG. 20 illustrates a multi-chip module 1007 which distinguishes from the multi-chip module 1006 shown in FIG. 19 in that the standard power integrated circuit pad 6 is broken up into three standard power integrated circuit pads 6a, 6b, 6c for mounting three or more standard power integrated circuits. Again, the first external terminals 5a, 5b, 5c, 5d, 5e, 5f, 5g, 5h, 5i, 5j, 5k, 5l, 5m, 5n, 5o, 5p define a confined and contiguous region X opposite to and separated from the second external terminals 4a, 4b, 4c.

Figure 21:
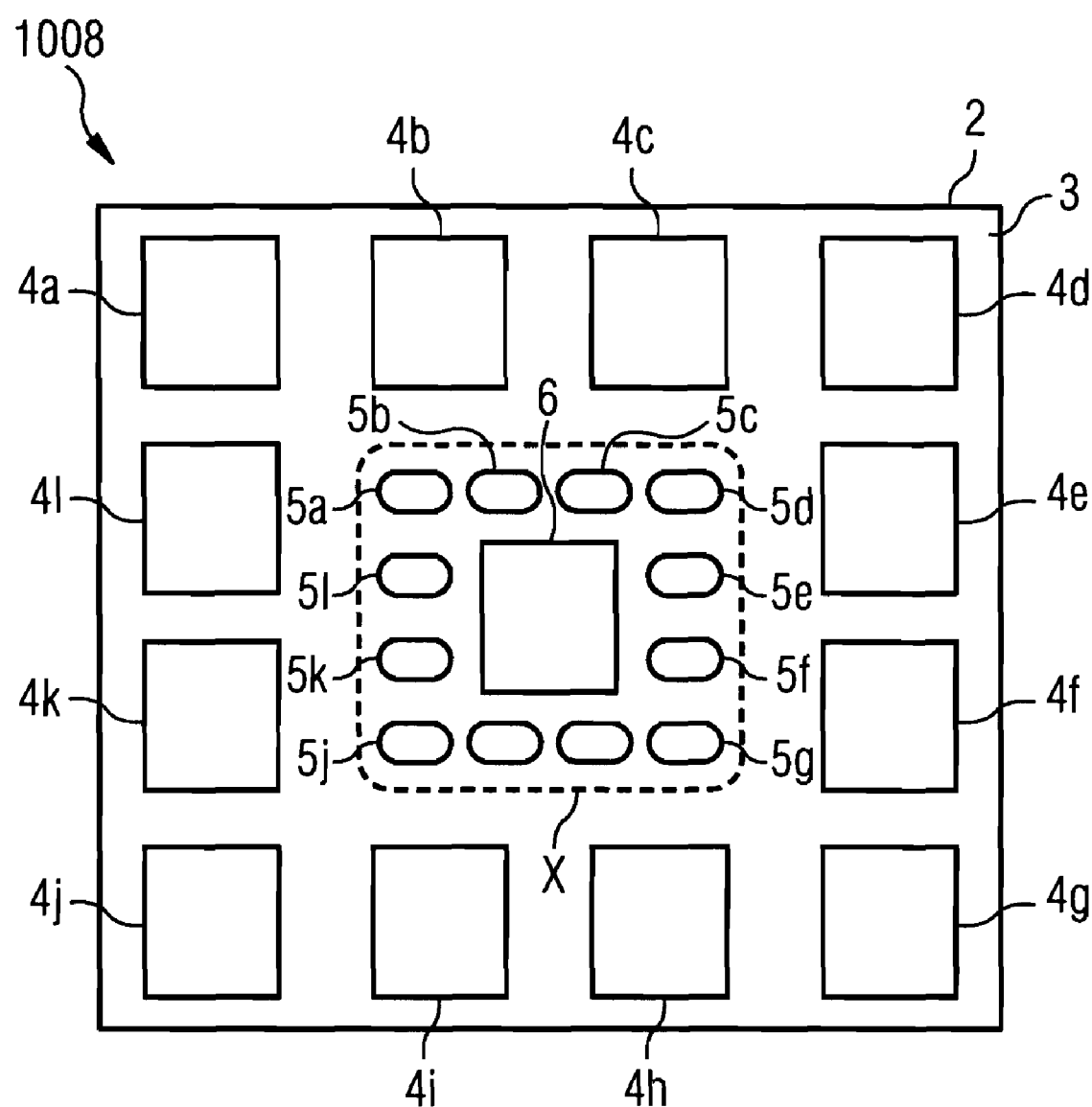
FIG. 21 illustrates a footprint of a power multi-chip module having power terminals and control terminals according to a seventh embodiment shown in FIG. 19.

FIG. 21 illustrates another multi-chip module 1008. Here, the first external terminals 5a, 5b, 5c, 5d, 5e, 5f, 5g, 5h, 5i, 5j, 5k, 5l are arranged in a closed line or circle-like fashion surrounding die pad 6. Pad 6 is a die pad for one or more (standard power) integrated chips. Pad 6 may be located in the center of the multi-chip module 1008. Pad 6 may or may not constitute a first external terminal for coupling the standard power integrated circuits disposed thereon to an application board. Second external terminals 4a, 4b, 4c, 4d, 4e, 4f, 4g, 4h, 4i, 4j, 4k, 4l may be arranged circumferential to the circle or O-shaped line of first external terminals 5a, 5b, 5c, 5d, 5e, 5f, 5g, 5h, 5i, 5j, 5k, 5l defining a contiguous region X in which no second terminal 4a, 4b, 4c, 4d, 4e, 4f, 4g, 4h, 4i, 4j, 4k, 4l is situated.

As both the standard power integrated circuit pad 6 and the first external terminals 5a, 5b, 5c, 5d, 5e, 5f, 5g, 5h, 5i, 5j, 5k, 5l are located in the region X which is separated from a region in which the second external terminals 4a, 4b, 4c, 4d, 4e, 4f, 4g, 4h, 4i, 4j, 4k, 4l are situated, the multi-chip module 1008 allows to be power-scaled without the need to rearrange the first external terminals 5a, 5b, 5c, 5d, 5e, 5f, 5g, 5h, 5i, 5j, 5k, 5l and die pad 6.

Summarizing, all embodiments of multi-chip modules described above allow for a standard pinning of the multi-chip module with regard to the first external terminals associated with the standard power integrated circuit(s). This standard pinning does not need to be changed through all power classes or sizes of the multi-chip module.

First external terminals, second external terminals (if applicable also used as power semiconductor chip die pads) and standard power integrated circuit die pads may be part of a leadframe being structured by means of stamping, etching or other known techniques in the art.

Another technique for producing first and second external terminals and chip carriers is the so-called TSLP (Thin Small Leadless Package) technique depicted in FIGS. 22a to 22e. This technique allows to produce a multi-chip package with flexible footprint configuration and efficient heat transfer performance. Starting point of the assembly process is a metal carrier 500 made of a first metal (e.g., copper) on which contacts 501 made of another metal (for instance nickel) are disposed. If the wirebond technology is used, in a first step of the assembly process, a chip 502 (power semiconductor chip or standard power integrated circuit) is attached to one of the large contacts 501 on the metal carrier 500, see FIG. 22a. Then, the chip 502 and all other chips to be mounted are wirebond-bonded to the individual contacts 501, see FIG. 22b. Alternatively, for flip-chip interconnect technology (see FIG. 22c), metal balls (e.g., AuSn) and/or pillars (e.g. Cu) are applied to the chip 502. Then the chip 502 is placed upside-down on the metal carrier 500 and the contact balls 503 are soldered on the contacts 501.

Figure 22A:
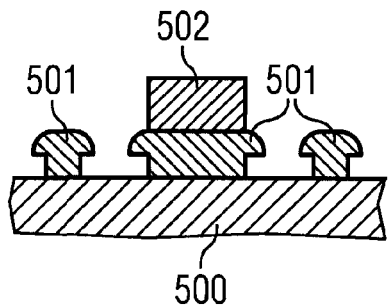
FIGS. 22a to 22e illustrate manufacturing steps used for packaging a multi-chip module.
Figure 22B:
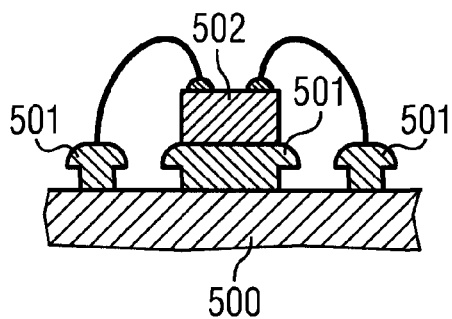
Figure 22C:
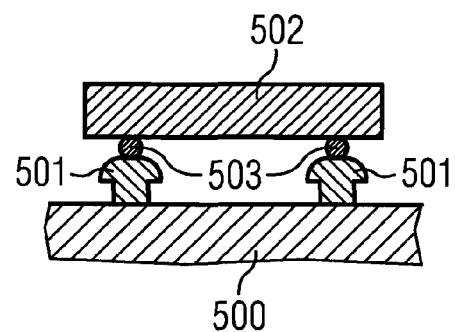
Figure 22D:
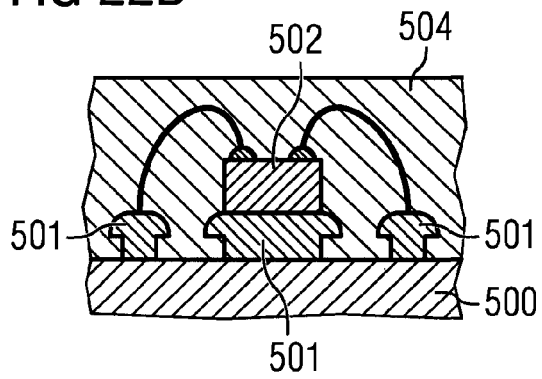
Figure 22E:
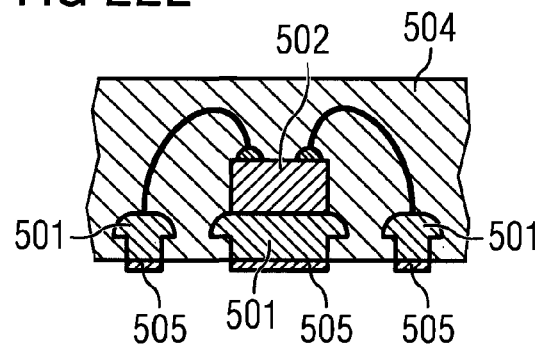

In FIG. 22d, the array is molded using a mold compound 504. After the molding process, the copper of the carrier 500 is etched. The contacts 501 are not etched because they are made of an etch-resistant material, for instance Ni. The blank contacts 501 may then be electro-plated with a thin metal layer 505, e.g., made of Au.

The TSLP technology allows to generate insular chip pads or terminal pads as, for instance, are needed for the two-dimensional arrays of first external terminals depicted in FIGS. 13, 14, 15, 16 and 17. The TSLP technology is applicable to all embodiments illustrated above.

What is claimed is:

1. A multi-chip module, comprising:
at least one integrated circuit chip that is electrically coupled externally only to first external terminals of the multi-chip module wherein all first external terminals of the multi-chip module define a first contiguous region of a terminal area of the multi-chip module; and
at least one power semiconductor chip that is electrically coupled externally only to second external terminals of the multi-chip module, wherein all of the second external terminals of the multi-chip module are arranged in a second contiguous region of the terminal area separate from the first contiguous region, wherein the terminal area of the multi-chip module is a bottom of the multi-chip module, and wherein one of the first and second external terminals are disposed along all four sides of the bottom of the multi-chip module.

2. The multi-chip module according to claim 1, wherein the integrated circuit chip is a standard power integrated circuit.

3. The multi-chip module according to claim 1, wherein the first contiguous region is defined by one linear array or a plurality of adjoining linear arrays of first external terminals.

4. The multi-chip module according to claim 1, wherein the first contiguous region is defined by a two-dimensional array of first external terminals.

5. The multi-chip module according to claim 1, wherein at least one side of the terminal area along which second external terminals extend is free of first external terminals.

6. The multi-chip module according to claim 1, wherein the at least one integrated circuit chip and the at least one power semiconductor chip are arranged at opposite sides of the multi-chip module.

7. The multi-chip module according to claim 1, wherein the at least one integrated circuit comprises a logic circuit.

8. The multi-chip module according to claim 1, wherein the at least one integrated circuit comprises a control circuit for controlling the at least one power semiconductor chip.

9. The multi-chip module according to claim 1, wherein the multi-chip module comprises part of a voltage converter circuitry.

10. A multi-chip module, comprising:
- at least one integrated circuit chip that is electrically coupled externally only to first external terminals of the multi-chip module wherein all first external terminals of the multi-chip module define a first contiguous region of a terminal area of the multi-chip module; and
- at least one power semiconductor chip that is electrically coupled externally only to second external terminals of the multi-chip module, wherein all second external terminals of the multi-chip module are arranged in a second contiguous region of the terminal area separate from the first contiguous region, and wherein the first contiguous region and the second contiguous region are separated over the terminal area by an O-shaped line or a closed polygonal line.

11. The multi-chip module according to claim 1, wherein the first contiguous region is located at about the center of the terminal area.

12. The multi-chip module according to claim 1, further comprising a chip carrier on which the at least one integrated circuit chip is mounted.

13. The multi-chip module according to claim 1, wherein the at least one power semiconductor chip is mounted on a second external terminal.

14. The multi-chip module according to claim 1, further comprising a mold compound encapsulating the at least one integrated circuit chip and the at least one power semiconductor chip.

15. The multi-chip module according to claim 10, wherein the first contiguous region is located at about the center of the terminal area.

16. The multi-chip module according to claim 12, wherein the chip carrier comprises a metal leadframe.

17. The multi-chip module according to claim 12, wherein the chip carrier comprises insular pre-structured metal pads.

* * * * *